United States Patent [19]
Popat et al.

[11] Patent Number: 6,133,336
[45] Date of Patent: *Oct. 17, 2000

[54] PROCESS FOR FORMING A COLORED THREE-DIMENSIONAL ARTICLE

[75] Inventors: Ajay Haridas Popat, Warrington; Martin Russell Edwards, Chester, both of United Kingdom

[73] Assignee: Zeneca Limited, London, United Kingdom

[*] Notice: This patent issued on a continued prosecution application filed under 37 CFR 1.53(d), and is subject to the twenty year patent term provisions of 35 U.S.C. 154(a)(2).

[21] Appl. No.: 08/705,846

[22] Filed: Aug. 30, 1996

[30] Foreign Application Priority Data

Sep. 9, 1995 [GB] United Kingdom ............... 9518488
Oct. 18, 1995 [GB] United Kingdom ............... 9521292

[51] Int. Cl.$^7$ ..................................................... C08F 2/46
[52] U.S. Cl. ........................ 522/31; 522/4; 522/15; 522/18; 522/44; 522/64; 264/494; 430/374; 430/334; 430/394
[58] Field of Search ..................... 522/25, 64, 4, 522/18, 44, 31, 15; 427/574, 570; 430/269, 284.1, 294, 357, 327, 334, 394, 374, 335, 340, 332, 346, 914, 921; 264/401, 497, 494

[56] References Cited

U.S. PATENT DOCUMENTS

| | | | |
|---|---|---|---|
| 4,251,619 | 2/1981 | Kurita | 430/292 |
| 4,575,330 | 3/1986 | Hull | 425/174.4 |

(List continued on next page.)

FOREIGN PATENT DOCUMENTS

| | | | |
|---|---|---|---|
| 0 223 587 | 5/1987 | European Pat. Off. | C08F 2/50 |
| 0 251 049 | 1/1988 | European Pat. Off. | G03F 7/105 |
| 0 339 841 | 11/1989 | European Pat. Off. | C08F 2/50 |
| 5-212804 | 8/1993 | Japan | B29C 67/00 |
| 89/09687 | 10/1989 | WIPO | B29C 35/08 |
| 90/10254 | 9/1990 | WIPO | G03F 7/031 |
| 92/15620 | 9/1992 | WIPO | C08F 2/50 |
| 95/01257 | 1/1995 | WIPO | B29C 67/00 |

OTHER PUBLICATIONS

Hassoon, S and Neckers, D, Electron Transfer Photoreduction of 5,7–Diiodo–3–butoxy–6–fluorone with Tetrabutylammonium Triphenylbutylborate and N,N–Dimethyl–2, 6–diisopropylaniline, J. Phys. Chem., 1995, 99, 9416–9424, Jun. 8, 1995.

Neckers, Stereolithography: An introduction, Oct. 1990, Chemtech, pp. 615–619.

Lee, Suk–Kyu & Neckers, D.C., Two–Photon Radical–Photoinitiator System Based on Iodinated Benzospiropyrans, 1991, American Chemical Society, pp. 858–864.

Kumar, G. Sudesh & Neckers, D.C., Laser–Induced Three–Dimensional Photopolymerization Using Visible Initiators and UV Cross–Linking by Photosensitive Comonomers, 1991, American Chemical Society, pp. 4322–4327.

Petillon, Jeezequel & Andre, Color Stereophotolithography: A Method of 3–D Color Imaging, 1996, IS&T, pp. 42–49.

McAloon, Edwards & Popat, Selectively–Coloured Sterolithography Models, Dec. 1995, EARP.

Shou, Hansen & Neckers, D.C., Formation of Multicolor Polymeric Objects by Laser–Initiated Photopolymerization, 1995, IS&T, pp. 18–26.

*Primary Examiner*—Nam Nguyen
*Assistant Examiner*—Steven H. VerSteeg
*Attorney, Agent, or Firm*—Pillsbury Madison & Sutro LLP

[57] ABSTRACT

Process for forming a selectively colored polymeric layer, or a three-dimensional article made of polymeric layers, wherein a photocurable, photocolorable composition is irradiated with a low dose of light to cure and a different, preferably higher, dose of light to color. The process is particularly useful for preparing selectively colored ornamental and industrial articles and models of plant and animal parts, especially medical models.

24 Claims, 2 Drawing Sheets

U.S. PATENT DOCUMENTS

| | | | |
|---|---|---|---|
| 4,659,649 | 4/1987 | Dickinson et al. | 430/280 |
| 4,716,097 | 12/1987 | Weed | 430/327 |
| 4,752,498 | 6/1988 | Fudim | 427/54.1 |
| 4,801,477 | 1/1989 | Fudim | 427/54.1 |
| 4,842,980 | 6/1989 | Gottschalk | 430/138 |
| 4,937,159 | 6/1990 | Gottschalk | 430/138 |
| 4,977,511 | 12/1990 | Gottschalk | 564/473 |
| 4,987,044 | 1/1991 | Vassiliou | 430/20 |
| 5,137,800 | 8/1992 | Neckers | 430/281 |
| 5,151,520 | 9/1992 | Gottschalk | 548/110 |
| 5,198,159 | 3/1993 | Nakamura et al. | 264/22 |
| 5,230,986 | 7/1993 | Neckers | 430/281 |
| 5,514,519 | 5/1996 | Neckers | 430/269 |
| 5,576,146 | 11/1996 | Ali | 430/286.1 |
| 5,677,107 | 10/1997 | Neckers | 430/269 |
| 5,698,373 | 12/1997 | Fujikawa et al. | 430/288.1 |
| 5,753,417 | 5/1998 | Ulrich | 430/312 |

PROCESS FOR FORMING A COLORED THREE-DIMENSIONAL ARTICLE

BACKGROUND OF THE INVENTION (1) Field of the Invention

This invention relates a process for producing a polymeric layer having a desired image thereon and to a process for forming three-dimensional articles having selectively coloured regions, formed from a plurality of the aforementioned polymeric layers.

(2) Description of Related Prior Art

A photopolymerisable composition containing crystal violet lactone and the photoinitiator called Lucirin TPO is known from European patent application No.251,049. The compositions were apparently used to produce a photoresist layer by applying them to a substrate, irradiating desired areas to form a polymer coating in the irradiated areas, then rinsing to remove areas which had not been irradiated.

A method for producing three-dimensional articles called 'stereolithography' is also known. This method comprises curing successive layers of a photopolymerisable liquid using a computer-controlled light source, e.g. a laser, and cohesively integrating the layers to give the desired article. Stereolithography has been used to prepare mechanical parts for cars, prosthetic devices, medical models and a variety of other articles having complex internal structures. Hull's U.S. Pat. No. 4,575,330, U.S. Pat. No. 4,752,498 and Hideo Kodama's article in Rev. Sci. Instrum. 52 (11), 1770–1773, Nov. 1981 describe this method in more detail.

Zeneca's international patent application No. PCT/GB94/01427 describes a stereolithography method for forming a three-dimensional article having at least one selectively coloured region from a photopolymerisable, photocolourable composition containing an infra-red absorber. In this process layers of the composition are cured by light of a wavelength outside the infra-red, e.g. UV light, and coloured by a beam of infra-red light.

SUMMARY OF THE INVENTION

According to the present invention there is provided a process for producing a polymeric layer having a desired image thereon from a photocurable, photocolourable composition comprising the steps:

a) curing a layer of the composition using light thereby forming a polymeric layer;

b) irradiating selected areas of the composition or polymeric layer with a different dose of light than the dose used in step a) thereby forming the desired image.

The use of different doses of light to cure with or without colouration may also be applied to the production of three dimensional articles.

Thus the invention also provides a process for forming a three-dimensional article having selectively coloured regions from a photocurable, photocolourable composition comprising the steps:

a) curing a layer of the composition using light thereby forming a polymeric layer;

b) irradiating selected areas of the polymeric layer resulting from step a) or of a layer of the composition with a different dose of light than used in step a) thereby forming selectively coloured areas;

c) repeating steps a) and b) on a previously formed polymeric layer until the desired three-dimensional article having selectively coloured regions is formed.

BRIEF DESCRIPTION OF THE DRAWINGS

This invention is further illustrated by reference to the attached drawings wherein.

Figure 1A:
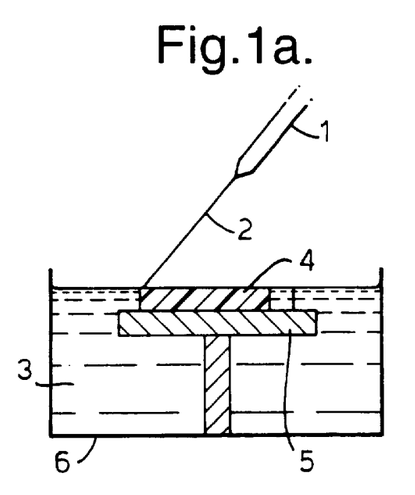
FIG. 1a is a side view in section showing formation of a polymeric layer by curing a layer of the composition.
Figure 1B:
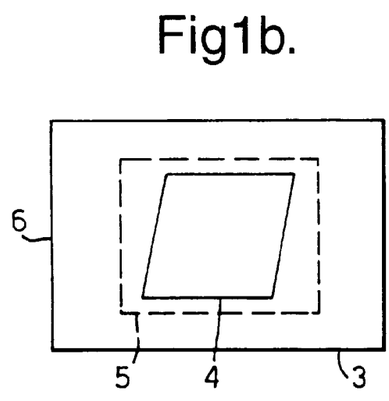
FIG. 1b is a top view showing the cured polymeric layer.

FIG. 1a shows a computer-controlled laser 1 irradiating a layer of a photocurable, photocolourable composition 3 above platform 5 which is capable of being raised and lowered within the bath 6. The laser 1 emits a low dose light beam 2 onto the composition 3 thereby forming polymeric layer 4. FIG. 1b is a top view of FIG. 1a showing the resultant parallelogram-shaped layer 4 resting on platform 5 in bath 6 of composition 3.

Figure 2A:
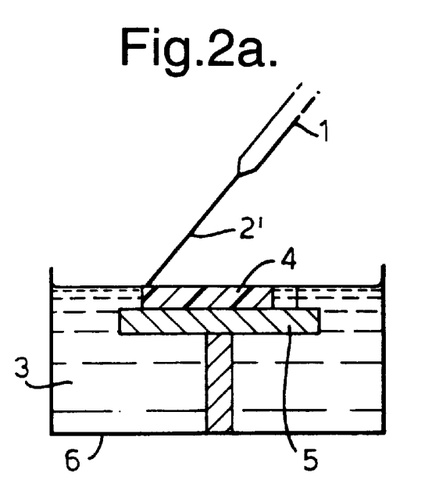
FIG. 2a is a side view in section showing formation of a desired image on a polymeric layer using a higher dose of light in selected areas.
Figure 2B:
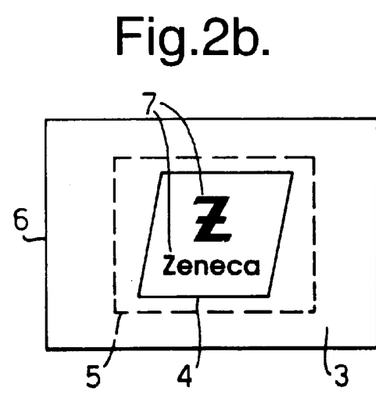
FIG. 2b is a top view showing the cured polymeric layer having the desired image thereon.

FIG. 2a shows the same laser 1 irradiating selected areas of polymeric layer 4 with a higher dose of light than used in FIG. 1a through light beam 2'. FIG. 2b shows a top view of FIG. 2a wherein the parallelogram-shaped polymeric layer bears the desired image 7. In FIGS. 2a and 2b, items 3, 5 and 6 have the same meaning as in FIG. 1a. If desired, platform 5 may be lowered further into composition 3 thereby allowing a fresh layer of the fluid composition to cover the previously formed, selectively coloured polymeric layer and the curing and colouration steps can be repeated until a desired three-dimensional article having selectively coloured regions results.

Figure 3:
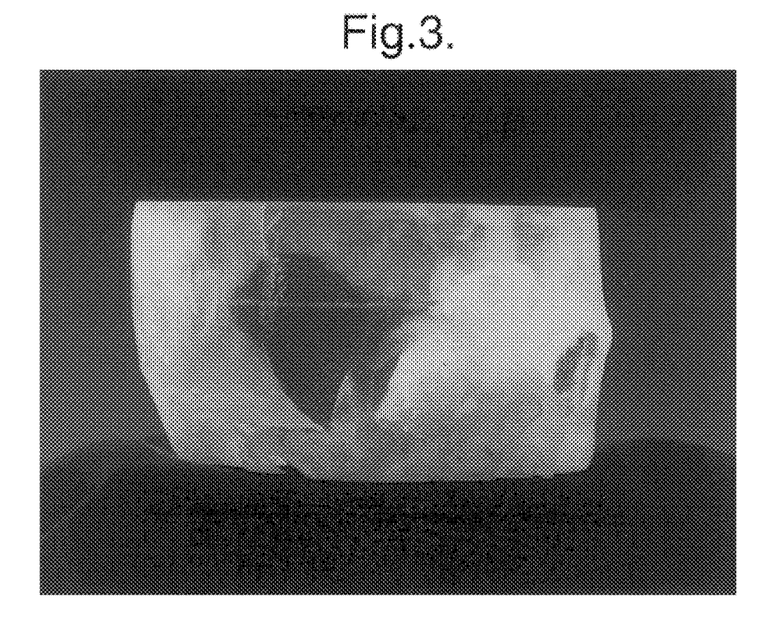
FIG. 3 and FIG. 4 show medical models prepared by the process for forming three-dimensional articles.

FIG. 3 shows a section of human skull model wherein a tumour in the temple area is selectively coloured (red in the original model). The blank horizontal line approximately ⅓ of the way down the tumour shows a test area where only a low dose of light was used to see if colour diffuses from high dose areas into low dose areas. No such diffusion was observed.

Figure 4:
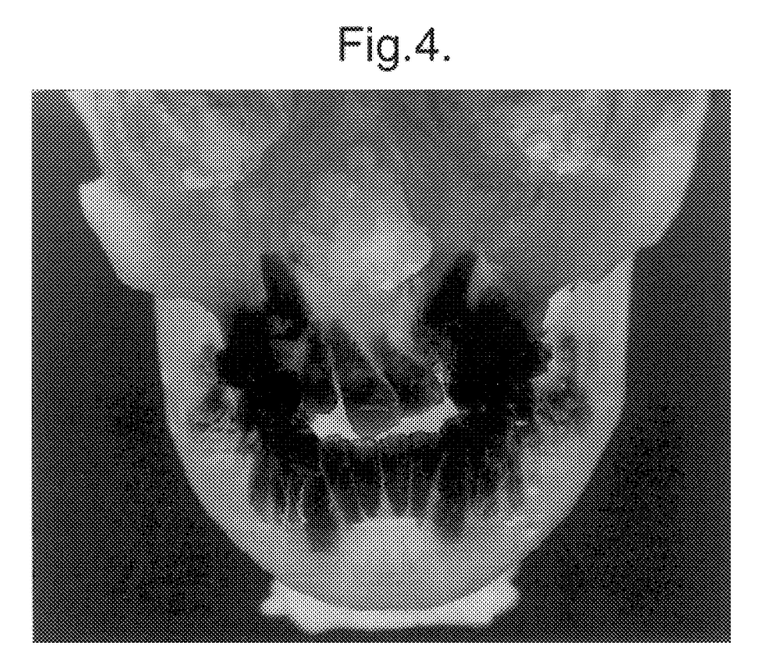

FIG. 4 shows a section of a human skull model wherein abnormal teeth, including their roots, are selectively coloured (blue in the original model).

Step b) can be performed before, during or after step a). Thus when step a) is performed before step b) the desired image can be formed on the polymeric layer using a higher dose of light than that used for curing or, if desired, the image can be formed on areas of the composition which had not been cured during step a). Step b) may be performed during step a) by varying the dose of light according to its position on the composition, for example such that areas which are desired to be cured without colour formation are given a low dose of light and areas which are desired to be cured with colour formation are given a higher dose of light. When step b) is performed before step a) the higher dose of light can both colour and cure selected areas of the composition and remaining areas of the composition are then cured without colour formation using a lower dose of light than that used in step b). If holes are required in the polymeric layer one can simply not irradiate appropriate areas of the composition.

DESCRIPTION OF PREFERRED EMBODIMENTS

As mentioned above, steps a) and b) can be performed in either order or simultaneously. The number of times steps a)

and b) are repeated depends on the thickness of polymeric layers and the size of the article. Thus steps a) and b) could be repeated 10 times if each polymeric layer was 1 mm deep and the article 1 cm high and 500 times if each polymeric layer was 0.5 mm deep and the article 25 cm high. Preferably the polymeric layers each independently have a depth of 0.01 to 1.5 mm, more preferably 0.1 to 1 mm, especially 0.2 to 0.6 mm, more especially 0.25 to 0.4 mm. Another alternative is for polymeric layers to have a depth of 0.1 to 0.4 mm. Naturally the polymeric layers need not all be of the same depth.

The dose of light used in step b) is preferably higher than the dose of light used in step a).

A higher dose of light used in step b) can be achieved by, for example, increasing the intensity of light and/or by increasing the length of time areas are illuminated irrespective of whether the light is of the same, higher or lower intensity. Preferably the light used in each of step a) and step b) has a wavelength below 700 nm, more preferably below 600 nm, especially below 500 nm, more especially 200 to 470 nm, particularly 250 to 400 nm. Preferably the wavelength(s) of light used in both steps is or are the same or substantially the same because advantageously this avoids the need for different light sources or expensive variable wavelength lasers and optics and allows selective colouration using conventional stereolithography apparatus having a single source of light. The light source is preferably a He-Cd laser or an Argon ion laser. This will be of great benefit to owners of stereolithography equipment as they will be able to prepare three dimensional articles having selectively coloured areas using their existing equipment.

The doses of light used in steps a) and b) are selected to effect a visually identifiable difference in colouration for the image and can be determined by simple trial and error. Thus if some colour is formed in cure step a) then step b) can give a visually identifiable difference by forming more colour in selected areas, by photobleaching areas which are not selected areas, or by changing colour in selected or non-selected areas to give the desired image. The precise doses used depend to some extent on the photocolourable ingredients contained in the composition. Typically, however, the dose of light used in step b) is preferably at least 1.2 times higher, more preferably 2 times higher, especially at least 5 times higher, more especially at least 10 times higher than the dose of light used in step a). The dose of light for step a) is usually below 1 J/cm$^2$, preferably below 0.5 J/cm$^2$.

When the dose of light used in step b) is higher than the dose of light used in step a) the desired image or the selectivity coloured areas are preferably formed by colour formation, colour change or photobleaching, preferably by colour formation.

When making a three-dimensional article one may not wish to form colour in some polymeric layers whilst other layers may be required to be entirely coloured, in addition to the polymeric layers which have selectively coloured areas. If colour formation is not required one may omit step b) for that layer and entire colouration can be achieved by irradiating the entire layer with the different, e.g. higher, dose of light.

The photocurable, photocolourable composition is preferably a light-curable resin which is capable of curing with or without colouration depending on the dose of light. Typically the composition comprises:
  (i) a light-curable resin;
  (ii) a compound which is convertible by a photochemical reaction into a developer; and
  (iii) a compound which forms colour or changes colour on contact with said developer.

The light curable resin is preferably an epoxy, vinyl ether or acrylate resin or a mixture thereof, especially an acrylate resin. Such light curable resins are described in EP 425,441 A2, EP 562,826A1, Canadian Patents No 2,079,652, 2,063, 982, 2,007,295, 2,028,541, 2,088,031 and 2,028,537 and International Patent Applications PCT/GB96/00517 and PCT/GB96/00518. Many light curable resins are commercially available, for example Cibatool XB5149, SOMOS 3100, 3110, 4100 and 4110 from Du Pont (He-Cd and Ar ion laser systems); Cibatool XB5081, XB5134 and XB5143 (He-Cd laser) from Ciba Geigy; and Cibatool XB5131 and XB5154 (Ar ion laser) from Ciba Geigy.

The light curable acrylate resin preferably comprises at least one (meth)acrylate monomer or oligomer, a photoinitiator and optionally a phenolic compound. Examples of meth(acrylate) monomers and oligomers include the following and combinations thereof: t-butyl(meth)acrylate, 1,5-pentanediol di(meth)acrylate, N,N-diethylaminoethyl(meth) acrylate, ethylene glycol(meth)acrylate, 1,4-butanediol (meth)acrylate, diethylene glycol(meth)acrylate, hexamethylene glycol di(meth)acrylate, 1,3-propanediol di(meth)acrylate, decamethylene glycol di(meth)acrylate, 1,4-cyclohexane diol di(meth)acrylate, 2,2-dimethylolpropane di(meth)acrylate, glycerol di(meth) acrylate, tripropylene glycol di(meth)acrylate, glycerol tri (meth)acrylate, trimethylolpropane tri(meth)acrylate, pentaerythritol tri(meth)acrylate, polyoxyethylated trimethylol propane tri(meth)acrylate, pentaerythritol tetra (meth)acrylate, 2,2-di-(p-hydroxyphenyl)-propane di(meth) acrylate, triethylene glycol di(meth)acrylate, polyoxyethyl-2,2-di(p-hydroxy)propane di(meth)acrylate, di(3-(meth) acryloxy-2-hydroxy propyl) ether of bisphenol-A, di-(2-(meth)acryloxyethyl) ether of bis-phenol-A, di-(3-methacryloxy-2-hydroxypropyl) ether of 1,4-butanediol, polyoxy-propyltrimethylol propane triacrylate, butylene glycol di(meth)acrylate, 1,2,4-butanetriol tri(meth)acrylate, 2,2,4-trimethyl-1,3-pentanediol di(meth)acrylate, 1-phenyl ethylene-1,2-di(meth)acrylate and 1,4-benzenediol di(meth) acrylate. Also useful are ethylenically unsaturated compounds, e.g., diallyl fumarate, styrene, 1,4-diisopropenyl benzene, 1,3,5-triisopropyl benzene, alkylene or a polyalkylene glycol diacrylate prepared from an alkylene glycol having 2 to 15 carbons or a polyalkylene ether glycol having 1 to 10 ether linkages, e.g., those having a plurality of addition polymerizable ethylenic linkages particularly when present as terminal linkages. Particularly preferred meth(acrylates) are ethoxylated trimethylolpropane tri(meth)acrylate, ethoxylated bisphenol A di(meth) acrylates, ethoxylated pentaerythritol tri(meth)acrylate, dipentaerythritol monohydroxypenta(meth)acrylate, 1,10-decanediol dimethylacrylate, di-(3-acryloxy-2-hydroxypropyl) ether of bisphenol A oligomers, di-(3-methacryloxy-2-hydroxyl alkyl) ether of bisphenol A oligomers, urethane(meth)acrylates and di(meth)acrylates and oligomers thereof, caprolactone(meth)acrylates and methacrylates, propoxylated neopentyl glycol di(meth) acrylate, and mixtures thereof.

Examples of photoiniators which are useful in the light curable resin either alone or in combination are described in U.S. Pat. No. 2,760,863 and include vicinal ketaldonyl alcohols, e.g. benzoin, pivaloin; acyloin ethers, e.g., benzoin methyl and ethyl ethers, benzil dimethyl ketal; α-hydrocarbon-substituted aromatic acyloins, including α-methylbenzoin, α-allybenzoin, α-phenylbenzoin, 1-hydroxycyclohexyl phenol ketone, diethoxyphenyl acetophenone and 2-methyl-1-[4-methylthio)-phenyl]-2-morpholinopropan-1-one; and acylphosphine oxides and sulphides.

The compound which is convertible by a photochemical reaction into a developer is preferably an acylphosphine oxide or sulphide and/or a compound which generates acid when irradiated.

The compound which generates acid when irradiated is preferably an onium salt, a latent sulphonic acid, a halomethyl-s-triazine, or metallocene or a chlorinated acetophenone.

Preferred onium salt photoiniators are aryl diazonium, diaryliodonium; triaryl sulphonium, triaryl selenonium, dialkyl phenacyl sulphonium, triaryl sulphoxonium, aryloxydiaryl sulphoxonium and dialkylphenacyl sulphoxonium salts (especially their salts with $BF_4^-$, $PF_6^-$, $AsF_6^-$ or $SbF_6^-$), more preferably the diaryliodonium and triaryl sulphonium salts which are relatively easy to prepare on a commercial scale.

The latent sulphonic acid is a compound which produces a sulphonic acid on irradiation with light. Preferred latent sulphonic acids are the α-sulphonyloxy ketones, e.g. benzoin tosylate, 4'-methylthio-2-(p-tosyloxy) propiophenone, α-toluene sulphonyloxy propiophenone; α-hydroxymethylbenzoin sulphonates, e.g. the methane sulphonate and p-toluene sulphonate of α-hydroxymethyl benzoin; nitrobenzyl esters of sulphonic acids, e.g. 2-nitrobenzyl tosylate, 2,4- and 2,6-dinitrobenzyl tosylate, p-nitrobenzyl-9,10-diethoxyanthracene-2-sulphonate; aryl diazidonaphthaquinone-4-sulphonates; α-sulphonyl acetophenones, e.g. α-toluene sulphonyl acetophenone and 2-methyl-2-(4-methylphenyl sulphonyl)-1-phenylpropane; methane sulphonate esters of 2-hydroxy- and 2,4-dihydroxybenzophenone; and 1,2,3,4-tetrahydro-1-naphthylideneimino-p-toluene sulphonate.

Preferred halo methyl-s-triazines are the 2-aryl-4,6-bis chloromethyl-s-triazines and preferred chlorinated acetophenones include 4-tert-butyl-α,α,α,-trichloroacetophenone and 4-phenoxy-(α,α-bis-dichloroacetophenone.

A preferred metallocene is (cyclopentadi-1-enyl)[(1,2,3, 4,5,6-n)-(1-methylethyl)benzene]-iron(1+)-hexafluoro phosphate (1−), available from Ciba Geigy 261.

A preferred acylphosphine oxide or sulphide is of the formula (I):

(I)

wherein:
$R^1$ and $R^2$ are each independently optionally substituted alkyl, aryl, heteroaryl or alkoxy, or $R^1$ and $R^2$ taken together with the P atom to which they are attached form a 5 or 6 membered ring;
$R^3$ is disubstituted or poly substituted aryl or heteroaryl group which has substituents A and B on the two carbon atoms adjacent to the point of bonding to the carbonyl group; and
X is a sulphur or oxygen atom.

When $R^1$ or $R^2$ is optionally substituted alkyl it is preferably optionally substituted $C_{1-6}$-alkyl, more preferably $C_{1-4}$-alkyl. When $R^1$ or $R^2$ is optionally substituted aryl it is preferably optionally substituted phenyl or naphthyl. When $R^1$ or $R^2$ is optionally substituted heteroaryl it is preferably optionally substituted thiophenyl or pyridyl.

The optional substituents which may be present on $R^1$ and $R^2$ are preferably selected from halo, especially chloro; $C_{1-4}$-alkoxy, especially, methoxy, ethoxy, isopropoxy and n-butoxy; $C_{1-4}$-alkyl, especially methyl, ethyl, n-propyl, 2-propyl, n-butyl, t-butyl and i-butyl; nitro; cyano; carboxy; and sulpho.

Examples of groups represented by $R^1$ and $R^2$ include methyl, ethyl, propyl, butyl, amyl, hexyl, cyclopentyl, cyclohexyl, phenyl, chlorophenyl, dichlorophenyl, methyl phenyl, dimethyl phenyl, isopropyl phenyl, dimethyl phenyl, methoxy phenyl, dimethoxy phenyl, thiophenyl and pyridyl.

$R^3$ is preferably a phenyl, naphthyl or 5 or 6 membered heterocyclic ring (especially a fury, pyrrolyl, thienyl, pyranyl, pyridinyl or morpholinyl ring) having substituents A and B on the two carbon atoms adjacent to the point of bonding to the carbonyl group.

Substituents A and B are the same as each other or different and each is preferably $C_{1-4}$-alkoxy, especially methoxy or ethoxy; $C_{1-6}$-alkyl, especially methyl or ethyl; cycloalkyl, especially cyclohexyl or cyclopentyl; aryl, especially optionally substituted phenyl; $C_{1-4}$-alkylthio, especially $CH_3S-$ or $CH_3CH_2S-$; or halo, especially Cl or Br.

Preferred acylphosphine oxides are of the formula (II), (III) or (IV):

(II)

(III)

(IV)

wherein:
Z is H or a substituent, preferably H or one of the groups described above for A and B; and
$R^1$, $R^2$, A and B are as hereinbefore defined.

Examples of acylphosphine oxides and sulphides include 2,4,6-trimethylbenzoyldiphenyl phosphine oxide or sulphide; 2,4,6-trimethylbenzoyidiphenyl phosphine ditolyl phosphine oxide or sulphide; 2,4,6-trimethylbenzoyidiphenyl phosphinic acid, ethyl ester; 2,4, 6-trimethylbenzoyldiphenyl phosphinic acid, β-hydroxy ethyl ester; 2,4,6-trimethylbenzoyidiphenyl phosphine, allyl ester; 2,4,6-trimethylbenzoyldiphenyl phosphinic acid, ethyl ester; and 4-tert-butylbenzoyldiphenyl phosphine oxide or sulphide. The compound which forms colour or changes colour on contact with a photochemically generated developer is preferably a triaryl methane-, diphenyl methane-thiazine-, spiro-, lactam- or fluoran-based colour former. Examples of Triarylmethane-based colour formers include, 3-3-bis(p-dimethylaminophenyl)-6-dimethylaminophthalide, 3,3-bis(p-dimethylaminophenyl) phthalide, 3-(p-dimethylaminophenyl)-3-(1,2-dimethylindole-3-yl)phthalide, 3-(p-dimethylaminophenyl)-3-(2-methylindole-3-yl)phthalide, 3,3-bis(1,2-dimethylindole-3-yl)-5-dimethylaminophthalide, 3,3-bis(1,2-dimethylindole-3-yl)-6-dimethylaminophthalide, 3,3-bis (9-ethylcarbazole-3-yl)-6-dimethylaminophthalide, 3,3-bis (2-phenylindole-3-yl)-6-dimethylaminophthalide, 3-p-dimethylaminophenyl-3-(1-methylpyrrole-3-yl)-6-dimethylaminophthalide, etc., especially triphenyl methanes e.g. Crystal Violet Lactone.

Diphenylmethane-based colour formers include 4,4'-bis-dimethylaminobenzhydryl benzyl ether, N-halophenyl-leucoauramine and N-2,4,5-trichlorophenyl-leucoauramine.

Thiazine-based colour formers include benzoyl-leucomethylene blue and p-nitrobenzoyl-leucomethylene blue.

Spiro-based colour formers include 3-methyl-spiro-dinaphthopyran, 3-ethyl-spiro-dinaphthopyran, 3-phenyl-spirodinapthopyran, 3-benzyl-spiro-dinaphthopyran, 3-methyl-naphtho-(6'-methoxybenzo)spiropyran and 3-propyl-spiro-dibenzopyran.

Lactam-based colour formers include rhodamine-b-anilinolactam, rhodamine-(p-nitroanilino)lactam and rhodamine-(o-chloroanilino)lactam.

Fluoran-based colour formers include 3,6-dimethoxyfluoran, 3,6-diethoxyfluoran, 3,6-dibutoxyfluoran, 3-dimethylamino-7-methoxyfluoran, 3-dimethylamino-6-methoxylfluoran, 3-dimethylamino-7-methoxyfluoran, 3-diethylamino-7-chlorofluoran, 3-diethylamino-6-methyl-7-chlorofluoran, 3-diethylamino-6,7-dimethylfuoran, 3-(N-ethyl-p-toluidino)-7-methylfluoran, 3-diethylamino-7-(N-acetyl-N-methylamino)fluoran, 3-diethylamino-7-N-methylaminofluoran, 3-diethylamino-7-dibenzylaminofluoran, 3-diethylamino-5-methyl-7-dibenzylaminofluoran, 3-diethylamino-7-(N-methyl-N-benzylamino)fluoran, 3-diethylamino-7-(N-chloroethyl-N-methylamino)fluoran, 3-diethylamino-7-diethylaminofluoran, 3-(N-ethyl-p-toluidino)-6-methyl-7-phenylaminofluoran, 3-(N-ethyl-p-toluidino)-6-methyl-7-phenylaminofluoran, 3-diethylamino-7-(2-carbomethoxy-phenylamino)fluoran, 3-(N-ethyl-N-isoamylamino)-6-methyl-7-phenylaminofluoran, 3-(N-cyclohexyl-N-methylamino)-6-methyl-7-phenylaminofluoran, 3-pyrrolidino-6-methyl-7-phenylaminofluoran, 3-piperidino-6-methyl-7-phenylaminofluoran, 3-diethylamino-6-methyl-7-xylidinofluoran, 3-diethylamino-7-(o-chlorophenylamino)fluoran, 3-dibutylamino-7-(o-chlorophenylamino)fluoran and 3-pyrrolidino-6-methyl-7-p-butylphenylaminofluoran.

Colour formers permitting the production of a wide range of colours are known and have been described, for example, by Peter Gregory in High-Technology Applications of Organic Colourants, Plenum Press, pages 124–134.

The composition may advantageously contain a compound which generates free radicals on heating, preferably a peroxide, for example t-butylperoxy-3,5,5-trimethylhexanoate, t-butylperbenzoate, t-butyl-per-2-ethyl hexanoate or t-butylperoxide. Inclusion of such a compound followed by heating of the polymeric layer or three-dimensional article leads to an improvement in mechanical properties, particularly the tensile modulus which can in some cases increase by more than two fold. Thus in a preferred embodiment the composition contains a peroxide, preferably in an amount of 0.05 to 2%, more preferably 0.25 to 1% by weight, and the processes which use a composition containing a peroxide are preferably followed by the further step of heating the polymeric layer or three dimensional article.

The mechanical properties of the polymeric layer or three dimensional article may also be improved by irradiation light which does not cause colouration, e.g. light of high (i.e. long) UV wavelength. If desired a photoinitiator which does not generate acid when irradiated may be included which absorbs the high UV wavelength light, thereby facilitating a "post cure" using high UV wavelength light without unwanted colour formation. This post cure can be performed on the polymeric layer or three dimensional article using an appropriate U.V. oven.

When the only photochemically generatable developer is an acylphosphine oxide or sulphide it is preferred that the composition contains a phenolic compound, e.g. bisphenol A and/or benzyl-p-hydroxybenzoate.

The photocurable, photocolourable composition preferably comprises:

(a) 100 parts in total of (meth)acrylate monomers and/or oligomers;

(b) 0.01 to 10 parts, more preferably 1 to 5 parts in total of a photoinitiator;

(c) 0.01 to 4 parts, more preferably 0.05 to 1.5 parts in total of a compound which is convertible by a photochemical reaction into a developer;

(d) 0.01 to 4 parts, more preferably 0.05 to 1.5 parts in total of a compound which forms colour or changes colour on contact with said developer; and (e) 0 to 2 parts, more preferably 0 to 1 parts of a peroxide; wherein all parts are by weight.

Photocurable, photocolourable compositions of the above definition wherein the compound which is convertible by a photochemical reaction into a developer is a compound which generates acid when irradiated and the component (d) forms colour or changes colour on contact with said acid forms a further feature of the invention.

When the composition is free from compounds which generate acid when irradiated it preferably contains 0.1 to 20 parts, preferably 2 to 15 parts of a phenolic compound.

The photocurable, photocolourable composition may contain more than one, e.g. 1 to 7, compound which changes colour or forms colour on contact with a developer, and this can enable different colours to be generated according to the dose of light used in step b). For example, such a composition containing a first colour former which turns yellow at a medium dose of light and a second colour former which turns blue at a high dose of light would enable yellow and green (derived from yellow+blue) selectively coloured areas and images to be prepared. In this way one may produce desired images and areas in one, two or more colours, e.g. combinations of red, orange, yellow, green, blue, indigo and violet.

The process for forming a three-dimensional article preferably uses a stereolithography apparatus, for example the SLA 250 or 500 supplied by 3D—Systems or the Stereos 300, 400 and 600 supplied by EOS.

There is no particular limit on what the three dimensional article having selectively coloured regions can be, for example one may use the process to form ornamental and industrial articles and models of plant and animal parts (e.g. human body parts). Industrial articles include mechanical parts, especially those used in automobiles. Animal parts include bones, organs, tissues and combinations thereof. Examples of bones include joints (e.g. ball and socket joints such as the hip and shoulder, hinge joints such as the knee and elbow) the skull, jaw, spine, ribs, collarbone, shoulder blade, humerus, radius, ulna, teeth, finger and hand bones, breast bone, femur, tibia and fibula. Examples of organs include the liver, heart, lungs, kidneys, bladder, brain, eyes, intestines, pancreas and reproductive organs. Examples of tissue include muscle and cartilage. The process is particularly useful for producing selectively coloured models of animal parts and these can be used by a technician to assess the extent of certain illnesses and other disorders, or as a model for a surgeon to practice on before beginning surgery. For example, models of cancerous body parts can be produced wherein cancerous cells are coloured differently from healthy tissue. A surgeon can then practice or plan surgery using the model before beginning work on the patient.

As desired the three dimensional article having selectively coloured regions can be a model which is the same size, smaller or larger than the original article. Selectively coloured models which are larger than the original article are particularly useful for viewing small complicated internal features.

In a further embodiment the process comprises the further step of coating the polymeric layer or three dimensional article resulting from the present process with a visually transparent layer which absorbs the wavelength of light used in step b). This has the advantage of filtering out any light which could generate further unwanted colour, e.g. sunlight. A still further advantage is that the coating provides improved gloss and transparency and reduces or eliminates the "staircase" effect seen on three dimensional models prepared in a layer-wise manner.

The visually transparent coating preferably absorbs ultraviolet (UV) light. Materials used to prepare such coatings can be made by dissolving a UV absorbing compound in a mixture comprising a resin and one or more organic solvents, for example those UV absorbing compounds used in protective sun creams or Tinuvin 1135 and 400 available from Ciba Geigy, Bayer 325 and 340 available from Bayer PLC, and UV.Titan grade P370 and L530 available from Kemira of Finland. Suitable resins are thermoplastic acrylic resins, e.g. Neocryl B700 and B731 from Zeneca Limited.

The visually transparent coating is preferably applied to the polymeric layer or three dimensional article by dip or spray coating. With dip coating the depth of layer may be controlled by altering viscosity of the material used, with layer depth increasing with viscosity.

The invention is further illustrated by the following examples in which all parts and percentages are by weight unless specified otherwise.

The following abbreviations are used in the Examples:
SR344: Polyethylene glycol 400 diacrylate of MW 508 from Cray Valley.
SR349: Ethoxylated bisphenol A diacrylate from Cray Valley.
CN435: Trifunctional polyether acrylate from Cray Valley. (MW. approx. 950).
Diacryl 101: Ethoxylated bisphenol A dimethacrylate from Akzo.
NR 2720: NeoRad 2720 from Zeneca Resins, A urethane-acrylate oligomer.
Lucirin TPO: 2,4,6-trimethylbenzoyl diphenylphosphine oxide from BASF.
Darocur 1173: $Ph-CO-C(OH)(CH_3)CH_3$ from Ciba.
Irgacure 651: $Ph-C(O)-C(OCH_3)_2Ph$ from Ciba.
Irgacure 184: $C_6H_{10}(OH)C(O)Ph$ from Ciba.
Pergascript I-2RN: A colour former supplied by Ciba.
Pergascript I-6B: A colour former supplied by Ciba.
Cyracure UVI-6974: Mixed triaryl sulphonium hexafluoro antimonate salts which generate acid when irradiated.
Cyracure UVI-6990: Mixed triary sulphonium hexafluoro phosphate salts which generate acid when irradiated.

Ec is the critical energy at which polymer is at the "gel point" corresponding to the transition from liquid phase to the solid phase. Therefore for the compositions, when the exposure is less than a critical value, Ec, the composition remains liquid and when exposure is greater than Ec, the composition polymerises. Ec is measured in milijoules per centimetre squared (mj/cm2). Dp is the "penetration depth" of the resin defined as the depth of resin which results in a reduction in the irradiance to a level equal to 1/e of the surface irradiance, where e=2.7182 . . . , the base of natural logarithms. Dp is measured in mils (1/1000 of an inch) or in mm.

EXAMPLE 1

A photocurable, photocolourable composition was prepared ("Composition A") by mixing the following ingredients:

| Ingredient | Weight (g) |
| --- | --- |
| SR349 | 58.2 |
| SR344 | 12.3 |
| CN435 | 9.4 |
| Crystal violet lactone | 1.5 |
| bisphenol A | 13.1 |
| Lucirin TPO | 5.5 |

Composition A was coated onto a metal panel and the 250 μm thick layer cured with a fusion systems "D" bulb using a dose of 0.5 $J/cm^2$. The "D" bulb is a broad-band U.V. source with output mainly between 350 and 450 nm.

A mask was placed over the cured, colourless polymeric layer and the unmasked areas were irradiated using the "D" bulb at a dose of 6 $J/cm^2$. When the mask was removed, a polymeric layer was observed in which masked areas were colourless and unmasked areas had a deep blue colour.

COMPARATIVE EXAMPLES

When example 1 was repeated except that Lucirin TPO was replaced by Darocur 1173 or Irgacure 184 the composition cured to give a polymeric layer but no colour formed, even when the layer was irradiated at a dose of 10 $J/cm^2$.

EXAMPLE 2

A photocurable, photocolourable composition was prepared ("Composition B") by mixing the following ingredients:

| Ingredients | Weight (g) |
| --- | --- |
| SR349 | 60.9 |
| SR344 | 12.8 |
| CN435 | 9.8 |

| Ingredients | Weight (g) |
| --- | --- |
| Crystal Violet lactone | 0.76 |
| bisphenol A | 13.0 |
| Lucirin TPO | 2.75 |

Composition B was loaded into the bath of a stereolithography machine fitted with a Spectra Physics argon laser. The resin parameters Ec and Dp were measured and found to be 6.5 mJ/cm$^2$ and 2.2 mils respectively. Single polymeric layers were prepared using different scan speeds to vary the UV dose. It was found that below a U.V dose of 2 J/cm$^2$ the polymeric layer was essentially colourless and above this dose the layer became noticeably blue, with the intensity of colour increasing with dose. Thus the composition can be used to prepare three-dimensional articles having selectively coloured regions using the low dose to cure uncoloured regions and the high dose to colour and cure selected coloured regions.

EXAMPLE 3

The method of Example 2 was repeated except that in place of composition B there was used a composition comprising NR 2720, di-and tri-functional acrylate and methacrylate monomers, Pergascript I-2RN (0.3%), Cyracure UVI-6974 (0.5%), Irgacure 651 (1.75%) and Lucirin TPO (0.25%). The resin parameters Ec and Dp were 7.8 mJ/cm$^2$ and 4.7 mils respectively. It was found that below a dose of 0.34 J/cm$^2$ the polymeric layer was essentially colourless and higher doses gave increasing colour up to a maximum coloration achieved at 2.5 J/cm$^2$.

The composition was used to build a three-dimensional article having selectively coloured regions by the stepwise formation of polymeric layers formed one on top of the other. A dose below 0.34 J/cm$^2$ was used in areas where no colour was required and a higher dose was used in selected areas to form colour. The resultant three-dimensional article was clear and transparent with well-defined zones of high intensity blue colouration. Furthermore, the clear, colourless areas allowed the internal blue regions to be observed from the outside.

EXAMPLE 4

A photocurable, photocolourable composition was prepared by mixing the following ingredients:

| Ingredients | Amount (g) |
| --- | --- |
| SR349 | 70.0 |
| CN435 | 11.3 |
| SR344 | 14.7 |
| Pergascript | 0.5 |
| Irgacure 651 | 3.0 |
| Cyracure UVI-6974 | 0.5 |

The above composition was processed in a stereolithography apparatus as described in Example 2. The resin parameters Ec and Dp were found to be 2.2 mJ/cm$^2$ and 2.5 mils respectively. It was found that below a dose of 0.27 J/cm$^2$ the resultant polymeric layer was essentially colourless and maximum colouration occurred at a dose of about 2.7 J/cm$^2$.

EXAMPLE 5

A composition containing a peroxide was prepared containing NR 2720 (29.7 g), a mixture of di- and tri-functional acrylate and methacrylate monomers (67.1 g), Pergascript I-2RN (0.21 g), Irgacure 651 (1.74 g), Lucirin TPO (0.5 g) and Cyracure UVI—6974 (0.33 g) and tert-butyl peroxy-3,5,5-trimethylhexanoate (0.5 g).

Samples of the resin were then partially cured in moulds (approx. 1 mm thickness) using a U.V oven (30 sec. exposure to give a U.V. dose of approx. 0.5 J/cm$^2$). Tensile measurements using an Instron 1122 Tensometer (measured at 25° C., 5 mm/min strain rate) showed a tensile modules of 225 MPa. Similarly prepared samples were heated at 100° C. for up to 2 hours. Tensile measurements showed tensile module of 490 MPa after 30 minutes, 650 MPa after 1 hour and 790 MPa after 2 hours. Further heating did not increase the modulus further.

EXAMPLE 6

A composition was prepared as described in Example 5 except that the peroxide was omitted. The composition was placed in a mould of about 1 mm thickness and irradiated for 5 min in a visible light box containing several bulbs with an output predominantly between 400 and 500 nm and dose of about 20 mW/cm$^2$. The resultant polymeric layer was transparent and colourless.

Half of the polymeric layer was masked and the other half irradiated for 80 seconds in a U.V. oven emitting light of wavelength 200–400 nm. The masked half remained colourless, whereas the unmasked half turned dark blue.

EXAMPLE 7

A composition was prepared comprising NR 2720, di- and tri-functional acrylate and methacrylate monomers, Pergascript I-6B (0.1%), Cyracure UVI 6974 (0.16%), Irgacure 651 (1.75%) and Lucirin TPO (0.25%). The resin parameters Ec and Dp were 5 mJ/cm$^2$ and 10.1 mils respectively. It was found that below a dose of 0.84 J/cm$^2$ the polymeric layer was essentially colourless, and higher doses gave increasing red colour up to a maximum coloration achieved at around 1.9 J/cm$^2$.

EXAMPLE 8

A composition was prepared comprising NR 2720, di- and tri-functional acrylate and methacrylate monomers, Pergascript I-6B (0.05%), Cyracure UVI 6990 (0.05%), Irgacure 651 (1.5%) and Lucirin TPO (0.5%). This composition was loaded into the vat of a stereolithography apparatus (an SLA 250 from 3D systems Inc, USA) equipped with He-Cd laser. The resin processing parameters Ec and Dp were measured and found to be 7.6 mJ/cm$^2$ and 5.4 mils respectively. Single polymeric layers were prepared using different scan speeds to vary the dose of UV light. It was found that below the UV dose of 100 mJ/cm$^2$ the polymeric layer was essentially colourless and above this dose the layer became noticeably red with the intensity of colour increasing with dose. A clear layer of 0.25 mm depth with overcure of 0.1–0.15 mm required a dose of 77 mJ/cm$^2$ and the laser velocity to achieve this was 185 mm/sec. Thus the composition can be used to prepare three-dimensional articles having selectively coloured regions using a low dose to cure uncoloured regions and a high dose to colour and cure selected regions using stereolithography apparatus equipped with a He-Cd laser.

EXAMPLE 9

The method of Example 8 was repeated except that in place of Irgacure 651 there was used Darocur 1173 (1.5%).

The resin parameters Ec and Dp were 12.3 mJ/cm² and 7.3 mils respectively.

It was found that below a dose of 100 mJ/cm² the polymeric layer was essentially colourless, and above this dose the layer became noticeably red, with the intensity of colour increasing with dose.

EXAMPLE 10

A UV absorbing compound (TINUVIN 1130 from Ciba Geigy) was dissolved in an acrylic resin diluted with organic solvent (2% by weight) and the resultant mixture was applied as a 50 µm layer to a cured, colourless film prepared according to the invention. The resultant sheet was found to last longer in daylight without generating unwanted colour.

TINUVIN 1130 is the reaction product of methyl 3-(3-2H-benzotriazole-2-yl)-5-t-butyl-4-hydroxyphenyl) propionate and polyethylene glycol 300.

Having described the invention in the foregoing, what is claimed is:

1. A process for forming a three-dimensional article having selectively coloured regions from a photocurable, photocolourable composition comprising the steps:
    a) curing a layer of the composition using light thereby forming a polymeric layer;
    b) irradiating selected areas of the polymeric layer resulting from step a) or of a layer of the composition with a higher dose of light than used in step a) thereby forming selectively coloured areas;
    c) repeating steps a) and b) on a previously formed polymeric layer until the desired three-dimensional article having selectively coloured regions is formed; wherein the wavelength(s) of light used in each of steps a) and b) is or are the same.

2. A process according to claim 1 wherein the selectively coloured areas are formed by colour formation, colour change or photobleaching.

3. A process according to claim 1 wherein the light used in each of step a) and step b) has a wavelength below 700 nm.

4. A process according to claim 1 wherein the light used in each of step a) and step b) is from a single source.

5. A process according to claim 1 wherein the dose light used in step b) is at least 2 times higher than the dose of light used in step a).

6. A process according to claim 1 wherein the photocurable, photocolourable composition comprises:
    (i) a light-curable resin;
    (ii) a compound which is convertible by a photochemical reaction into a developer; and
    (iii) a compound which forms colour or changes colour on contact with said developer.

7. A process according to claim 6 wherein the composition comprises:
    (a) 100 parts in total of (meth)acrylate monomers and/or oligomers;
    (b) 0.01 to 10 parts in total of photoinitiator;
    (c) 0.01 to 4 parts in total of a compound which is convertible by a photochemical reaction into a developer;
    (d) 0.01 to 4 parts of a compound which forms colour or changes colour on contact with said developer; and
    (e) 0 to 2 parts of a peroxide; wherein all parts are by weight.

8. A process according to claim 7 wherein the composition contains a peroxide.

9. A process according to claim 7 wherein the composition comprises at least one member of the group consisting of acrylate and methacrylate oligomers and monomers;
    a mixed triaryl sulphonium phosphate salt; and
    a triaryl methane-, diphenyl methane-, thiazine-, Spiro-, lactam- or fluoran-based colour former.

10. A process according to claim 6 wherein the compound which is convertible by a photochemical reaction into a developer is at least one compound selected from the group consisting of an aryl phosphine oxide, an aryl phosphine sulphide, and a compound which generates acid when irradiated.

11. A process according to claim 10 wherein the compound which generates acid when irradiated is an onium salt, a latent-sulphonic acid, a halomethyl-s-triazine, a metallocene or a chlorinated acetophenone.

12. A process according to claim 6 wherein the compound which forms colour or changes colour on contact with said developer is a triaryl methane-, diphenyl methane-, thiazine-, spiro-, lactam- or fluoran-based colour former.

13. A process according to claim 1 wherein the process uses a stereolithography apparatus.

14. A process according to claim 1 wherein the composition contains more than one compound which forms colour or changes colour on contact with a developer.

15. A process according to claim 1 which comprises a further step of coating the three-dimensional article resulting from step c) with a visually transparent layer which absorbs the wavelength of light used in step b).

16. A photocurable, photocolourable composition comprising:
    (a) 100 parts of (meth)acrylate monomers and/or oligomers;
    (b) 0.01 to 10 parts of a photoinitiator;
    (c) 0.01 to 4 parts in total of a compound which is convertible by a photochemical reaction into a developer;
    (d) 0.01 to 4 parts in total of a compound which forms colour or changes colour on contact with said developer; and
    (e) 0 to 2 parts of a peroxide;
wherein all parts are by weight and the compound which is convertible by a photochemical reaction into a developer comprises an acylphosphine oxide, acylphosphine sulphide, onium salt, latent sulphonic acid or metallocene.

17. A composition according to claim 16 which contains from 0.05 to 2% by weight of a peroxide.

18. A composition according to claim 16 wherein the compound which is convertible by a photochemical reaction into a developer comprises an acyl phosphine oxide or an acyl phosphine sulphide.

19. A composition according to claim 16 which is free from compounds which generate acid when irradiated and which further contains 0.1 to 20 parts of a phenolic compound.

20. A process for forming a three-dimensional article having selectively coloured regions from a photocurable, photocolourable composition comprising the steps:
    a) curing a layer of the composition using light thereby forming a polymeric layer;
    b) irradiating selected areas of the polymeric layer resulting from step a) or of a layer of the composition with a higher dose of light than used in step a) thereby forming selectively coloured areas;
    c) repeating steps a) and b) on a previously formed polymeric layer until the desired three-dimensional article having selectively coloured regions is formed; wherein said three-dimensional article is a model of a plant or animal part or a model of an automobile mechanical part.

21. A process according to claim 20 wherein the three-dimensional article is a model of an animal part selected from bones, organs, tissues and combinations thereof.

22. A process according to claim 20 wherein the three-dimensional article is a model of a body part subject to cancer wherein cancerous cells are coloured differently from healthy tissue.

23. A process for forming a three-dimensional article having selectively coloured regions from a photocurable, photocolourable composition comprising the steps:

a) curing a layer of the composition using light thereby forming a polymeric layer;

b) irradiating selected areas of the polymeric layer resulting from step a) or of a layer of the composition with a higher dose of light than used in step a) thereby forming selectively coloured areas; and c) repeating steps a) and b) on a previously formed polymeric layer until the desired three-dimensional article having selectively coloured regions is formed; wherein the light used in each of step a) and b) is from a single source.

24. A process for forming a three-dimensional article having coloured regions from a photocurable, photocolourable composition comprising the steps:

a) curing a layer of the composition using light thereby forming a polymeric layer;

b) irradiating selected areas of the polymeric layer resulting from step a) or of a layer of the composition with a different dose of light than used in step a) thereby forming selectively coloured areas; and c) repeating steps a) and b) on a previously formed polymeric layer until the desired three-dimensional article having selectively coloured regions is formed; and d) coating the three-dimensional article with a visually transparent layer which absorbs the wavelength of light used in step b).

* * * * *